United States Patent
Rigla Perez et al.

(10) Patent No.: US 10,197,651 B2
(45) Date of Patent: Feb. 5, 2019

(54) RADIOFREQUENCY SHIELD FOR HYBRID IMAGING DEVICES

(71) Applicants: General Equipment for Medical Imaging S.A., Valencia (ES); Consejo Superior de Investigaciones Cientificas (CSIC), Madrid (ES); Universitat Politecnica de Valencia, Valencia (ES); Bruker BioSpin AG, Fallanden (CH)

(72) Inventors: Juan Pablo Rigla Perez, Valencia (ES); Antonio Javier Gonzalez Martinez, Valencia (ES); Jose Maria Benlloch Baviera, Valencia (ES)

(73) Assignees: General Equipment for Medical Imaging S.A., Valencia (ES); Consejo Superior de Investigaciones Cientificas (CSIC), Madrid (ES); Universitat Politecnica de Valencia, Valencia (ES); Bruker BioSpin AG, Fallanden (CH)

( * ) Notice: Subject to any disclaimer, the term of this patent is extended or adjusted under 35 U.S.C. 154(b) by 0 days.

(21) Appl. No.: 15/637,730

(22) Filed: Jun. 29, 2017

(65) Prior Publication Data
US 2017/0299675 A1     Oct. 19, 2017

Related U.S. Application Data

(63) Continuation of application No. PCT/ES2015/070964, filed on Dec. 29, 2015.

(30) Foreign Application Priority Data
Dec. 31, 2014 (ES) .................................. 201431979

(51) Int. Cl.
     *G01R 1/42*         (2006.01)
     *G01R 33/422*     (2006.01)
     (Continued)

(52) U.S. Cl.
     CPC ......... *G01R 33/422* (2013.01); *G01R 33/481* (2013.01); *G01T 1/1603* (2013.01);
     (Continued)

(58) Field of Classification Search
CPC .. G01R 33/422; G01R 33/481; G01T 1/1642; G01T 1/2018
See application file for complete search history.

(56) References Cited

U.S. PATENT DOCUMENTS

| | | | |
|---|---|---|---|
| 7,218,112 B2 | 5/2007 | Ladebeck et al. | |
| 8,823,259 B2 | 9/2014 | Moody | |

(Continued)

FOREIGN PATENT DOCUMENTS

WO     WO 2011/087301        7/2011

OTHER PUBLICATIONS

Maramraju, S., "Evaluation of Electromagnetic Interactions between PET and MRI Systems for Simultaneous MRI/PET Imaging", Stony Brook University (2011).

(Continued)

*Primary Examiner* — Hugh H Maupin
(74) *Attorney, Agent, or Firm* — Caesar Rivise, PC

(57) ABSTRACT

The invention relates to a hybrid medical PET-SPECT/MR imaging device comprising at least one scintillating crystal and at least one module for detecting radiation which contains at least one matrix of photodetectors and an electronics section, such that said module has a mechanical structure, the external, internal or both surfaces of which are divided into at least two sections, of which at least one is coated in graphene, and the rest in non-ferromagnetic con- (Continued)

ductive material, or all the sections are coated in graphene, and such that the coating forms a Faraday cage. The invention also relates to a shielding against radiofrequency for a medical imaging device, comprising a graphene coating, which is continuous or in bands, on all the faces of the mechanical structure of the detection module of the device, or a graphene coating, continuous or in bands, on at least one face, combined with a coating of non-ferromagnetic conductive materials on the remaining faces, and said shielding forming a Faraday cage.

29 Claims, 5 Drawing Sheets

(51) Int. Cl.
  *G01T 1/202* (2006.01)
  *G01R 33/48* (2006.01)
  *G01T 1/164* (2006.01)
  *G01T 1/20* (2006.01)
  *G01T 1/29* (2006.01)
  *H05K 9/00* (2006.01)
  *G01T 1/16* (2006.01)

(52) U.S. Cl.
  CPC ............ *G01T 1/1642* (2013.01); *G01T 1/202* (2013.01); *G01T 1/2018* (2013.01); *G01T 1/2985* (2013.01); *H05K 9/002* (2013.01); *H05K 9/0088* (2013.01)

(56) References Cited

U.S. PATENT DOCUMENTS

| | | | |
|---|---|---|---|
| 2009/0195249 A1* | 8/2009 | DeMeester | G01R 33/28 324/318 |
| 2010/0092809 A1 | 4/2010 | Drzal et al. | |
| 2012/0253174 A1 | 10/2012 | Popescu | |
| 2012/0282419 A1 | 11/2012 | Anh et al. | |
| 2013/0068521 A1 | 3/2013 | Hong et al. | |
| 2013/0211233 A1 | 8/2013 | Yamaya et al. | |
| 2015/0008924 A1* | 1/2015 | Van Helvoort | G01R 33/422 324/318 |
| 2015/0369928 A1* | 12/2015 | Reese | G01T 1/2018 250/362 |
| 2016/0103194 A1* | 4/2016 | Schulz | G01R 33/422 324/309 |

OTHER PUBLICATIONS

Nacev et al., Rigla, "A Quiet, Fast, High-Resolution Desktop MRI Capable of Imaging Solids", Proceedings of ISMRM2014, Milan (Italy).
Paul, C.R., "Introduction to Electromagnetic Compatibility", Second Edition, Hardcover (2006).
Sun et al., "Single-Atom Catalysis Pt/Graphene Achieved Through Atomic Layer Deposition", Scientific Reports, Article No. 1775 (2013).
Terpstra, et al., "Localized Eddy Current Compensation Using Quantitative Field Mapping", J. Magn. Reson., vol. 131, pp. 139-143, (1998).
International Search Report for PCT Application No. PCT/ES2015/070964 dated Mar. 15, 2016.

* cited by examiner

RADIOFREQUENCY SHIELD FOR HYBRID IMAGING DEVICES

CROSS-REFERENCE TO RELATED APPLICATIONS

This bypass continuation application claims priority under 35 U.S.C. § 120 of International Application No. PCT/ES2015/070964 filed on Dec. 29, 2015 which in turn claims the benefit of Spanish Patent Application No. P201431979 filed on Dec. 31, 2014 and all of whose entire disclosures are incorporated by reference herein.

FIELD OF THE INVENTION

The main object of the present invention falls within the field of nuclear medicine and in particular is addressed to improve the electromagnetic compatibility between molecular imaging systems such as PET (Positron Emission Tomography) or SPECT (Single Photon Computed Emission Tomography) whose detection electronics is sensitive to the field of Radio Frequency (RF) of the Magnetic Resonance (MR).

BACKGROUND OF THE INVENTION

In the last decade, the interest in obtaining multimodal images, mainly PET/CT or SPECT/CT systems, has been increasing, aiming at acquiring structural (anatomic) and molecular medical images simultaneously. These systems open the possibility of obtaining metabolic or molecular images "in vivo" such as for example, by the PET technique. The most commonly used tracer in PET device is FDG (FluorDeoxiGlucose) which accumulates in anatomic regions with a high metabolism. These regions may be directly related to the anatomical or structural images obtained with the CT device.

More recently, the interest in the development of hybrid PET-SPECT/MR systems has increased, where mainly the anatomical information is obtained from MR, with the consequent reduction of exposure to ionizing radiation compared to CT systems. In a hybrid and simultaneous system, data acquisition times are also reduced, allowing more patients to be explored, as well as obtaining until now unique information, with the simultaneity of PET and MR data. Compared to CT systems, MR systems generally provide a greater contrast in soft tissues, more recently also in hard tissues, and a better spatial resolution in anatomical images of 50-100 µm [1], allowing, additionally, providing information on different physiological parameters.

From the technological point of view, the integration of a PET or SPECT device into an MR device is a great challenge. Mainly, there are two important problems that need to be solved when integrating PET-SPECT and MR device into a single device. The first problem is that the behavior of MR device can be affected by the presence of the elements used in the construction of PET-SPECT devices. For example, the detectors or the electronics associated with them may contain some quantities of ferromagnetic materials that can alter the magnetic field generated by MR devices. The second problem is the potential interferences in the electronics of the PET-SPECT device, generated by the RF signal that is produced in the RF coils with which the MR devices are provided.

To avoid interference of the RF signal in the electronics of the PET or SPECT device, a shield constructed with a non-ferromagnetic conductive material can be placed at this RF field. This shield is usually installed in the mechanical part that covers the detector block and does not interfere with the passage of the light produced in the scintillating crystal towards the photodetectors of the PET-SPECT device. Currently, SiPM (Silicon Photomultiplier) or APD (Avalanche Photodiodes) are the most proposed types of photodetectors in the design of hybrid PET/MR systems, since their operation is not affected by magnetic fields.

The problem is that RF shielding can also affect the magnetic field generated by MR device. By using a conductive material in this RF shield, both the gradient field at low frequencies and the RF signals generated by the MR device produce electric currents called Eddy currents on the surface of this shield, which can affect the homogeneity of the magnetic field of the MR device.

There are several solutions to reduce these currents: one is to divide the RF shield into smaller sections, smaller than 20×20 mm [3], or to increase the separation distance between the PET-SPECT device and the uniform magnetic field region of the MR device, what reduces the detection efficiency of the PET-SPECT device.

One possible solution is disclosed in U.S. Pat. No. 7,218,112-B2 which discloses a combined PET/MR system, in which the RF shield consists of a multitude of apertures, and the scintillation crystals of the PET detector are positioned in said apertures in such a way that at least one part of the crystals are located in the area of the reflux field of the RF. A drawback of such a solution is that the manufacturing process of the crystals must be modified to introduce in each of them the deposition of the shielding material. In any case, said solution is very different from that adopted in the present invention.

U.S. Pat. No. 8,823,259-B2 discloses a graphene sheet for the protection of photocathodes such as QE photocathodes—high quantum efficiency—. A graphene monolayer serves as a transparent screen that does not inhibit the passage of photons or electrons, but that isolates the photosensitive film from reactive gases avoiding contamination and extending the life of the photocathodes. The graphene sheet is placed on the photosensitive film in direct contact with it. In another embodiment the photocathode comprises: a film, the graphene sheet having a first and a second surface, a graphene support on a first portion of the first surface of the graphene sheet, and is configured to form a second portion of the first surface of the graphene sheet, said second portion having no graphene support, in such a way that the second portion of the graphene sheet is placed on the photosensitive film and in direct contact with it. Therefore, this shielding system is different from the one of the present invention, wherein it is intended to protect detector modules of medical imaging devices from the RF.

Another patent application, US20130068521-A1, discloses an electromagnetic field shield, in general, and a method for protecting the electromagnetic radiation using graphene on the inside, or the outside, of the source of electromagnetic waves and/or using graphene formed on a substrate, and also discloses an electromagnetic radiation protective material containing graphene, whereas in the present invention it is intended to shield the detector modules with a Faraday cage structure, minimizing Eddy currents and, in addition, allowing the passage of scintillating light, generated in the scintillating crystal, towards the photodetectors.

Patent application WO2011087301—relates to a method for forming a protective barrier of graphene, which has barrier properties against gas and moisture. A single or multiple layer of graphene can be used to protect various types of devices.

Generally, the RF shielding system consists of a layer of a non-ferromagnetic conductive metal (copper, silver or gold) or also of carbon fiber based composites, said layer completely covering the PET-SPECT device, or each of the PET-SPECT device modules individually. The shielding systems present the problem that both the gradient field and the RF field generated by the conventional MR devices generate electric currents called Eddy currents, on the surface of this shield, which can affect the uniformity of the magnetic field in the MR field of vision [4].

The aim of the present invention is the development of radiofrequency (RF) shield based on graphene and on non-ferromagnetic conductive materials to protect the electronics of the detection modules from the RF signal generated by the MR device, allowing the passage of scintillating light when this shield is placed between the scintillating crystal and the photodetectors. In addition, this electromagnetic shield must not shield or modify the magnetic fields generated by the main field or by the MR device gradient system.

In this invention a new type of radio-frequency shielding, of the Faraday cage-type, is presented, specific for hybrid imaging devices with the additional objective of reducing Eddy currents generated in the RF shielding, which may affect the homogeneity of the magnetic field generated by the MR device, as well as the objective of not shielding the main magnetic field and the magnetic fields generated by the gradient system of MR devices. The result is a RF shielding design, based in part on graphene, installed in the PET or SPECT devices, that allows the construction of more compact PET/MR or SPECT/MR hybrid devices, and therefore with better performance.

According to the present invention the graphene is placed just (very close) in front of the photodetector system to allow greater space (the crystal thickness) between the RF coil and the shield. Since the thickness of the graphene deposition is of one or two atoms, the light crosses it in a high percentage, also static or low frequency magnetic fields are crossed, but not the RF.

Throughout the present specification the terms "coating" and "shielding" are used with a completely equivalent meaning. Likewise, the terms "external" and "outer" are used with identical meaning. Also the terms "internal" and "inner" are used with identical meaning. We will refer to the combination of PET and MR, or SPECT and MR, as medical imaging hybrid systems or devices.

The expression "output face of the photons generated in the scintillating crystal" is equivalent to "face toward the photodetector"

SUMMARY OF THE INVENTION

The Faraday cage consists of two layers separated by a short distance, and connected to ground (or one to ground and the other one to low potential with respect to ground, to form a small capacitor) and segmented into small areas to avoid Eddy currents.

In this invention, in order to protect the photodetector matrix and the electronics (electronic acquisition, processing and signal transmission plates) placed inside each of the radiation detection modules of a PET-SPECT device, the structure called Faraday cage, designed specifically for the hybrid system, is used. The mechanical structure of the radiation detection modules is formed, according to particular embodiments, by two sections, constructed of different materials (graphene and non-ferromagnetic conductive metals) and brought into contact with each other forming a Faraday cage-like structure, with the aim of protecting the detection electronic of RF signals generated in the MR devices. A first section constructed with graphene is placed between the scintillating crystal and the photodetector matrix. The second section of the mechanical structure is placed on the remaining faces of each detector module, said section contains the matrix of photodetectors and the electronics of each module, constructed with a sheet of non-ferromagnetic conductive material (copper, silver, gold, fibers based on carbon nanotube or others).

In this way the section of the module that contains the scintillating crystal, monolithic or pixelated, encapsulated inside the mechanical structure that protects it from the outside light, and whose function is not affected by the RF signals, remains outside the Faraday cage. This prevents the generation of Eddy currents on the face of the detection module closest to the field of vision of the MR device, avoiding its interference with the RF and magnetic field of the MR device with respect to a detection module where the Faraday cage covers the entire detection module. This solution will allow placing the hybrid medical imaging device, preferably a PET-SPECT device, closer to the individual or animal to study, without distorting the RF field, and also without shielding the main magnetic field and the magnetic fields generated by the gradient system, allowing to design and build more compact PET-SPECT devices and increasing its detection efficiency.

The present invention relates firstly to a PET/MR or SPECT/MR hybrid medical imaging device comprising:
  at least one scintillating crystal, monolithic or pixelated, and
  at least one radiation detection module containing at least one matrix of photodetectors and a detection, acquisition and transmission electronics section, such that said detection module has a mechanical structure whose surface is divided into at least:
  a first section corresponding to the output face of the photons generated in the scintillating crystal and
  a second section corresponding to the remaining faces of the mechanical structure of the module, including at least one matrix of photodetectors and an electronics section and which does not enclose the scintillating crystal, such that said first and second sections form a closed structure, and of which:
  at least the first section is coated with graphene one or two atoms thick, and
  the second section is coated with graphene, one or two atoms thick, or with a non-ferromagnetic conductive material, and
  in which the surface of the mechanical structure is selected from:
  outer surface
  inner surface and
  both.

For any embodiment of the device, the graphene coating in the first section—section which always carries graphene coating as indicated in the previous paragraph—corresponding to the output face of the photons generated in the scintillating crystal, said output face is located between the scintillating crystal and the portion of the detection module that contains the matrix of photodetectors and the detection, acquisition and transmission electronics section may be a continuous or band-like coating. Said bands are separated from one another and arranged in two layers separated by a dielectric, in such a way that there is always spatial overlap between the two layers, as explained hereinafter in this specification.

For any embodiment of the device, the graphene coating in the second section (when this section is also coated with graphene) corresponding to the remaining faces of the mechanical structure of the detection module that includes at least one matrix of photodetectors and an electronics section, and which does not enclose the scintillating crystal, may be a continuous coating, or in the form of bands. Said bands are separated from one another and arranged in two layers separated by a dielectric, in such a way that there is always spatial overlap between the two layers, as explained hereinafter in this specification.

For any embodiment of the device, the coating with non-ferromagnetic conductive materials in the second section, when these materials are present, may also be a continuous coating, or in the form of bands. Said bands are separated from one another and arranged in two layers separated by a dielectric, in such a way that there is always spatial overlap between the two layers, as explained hereinafter in this specification.

In the hybrid device of the invention, the sections of the detection module surface are coated forming a Faraday cage. In addition, this Faraday cage is connected to ground to eliminate the electric charge generated in said Faraday cage.

According to a particular embodiment, only the first surface section of the detection module surface is coated with graphene, said section corresponding to the face of the scintillator crystal in the direction of the detection module, and the second section is coated by at least one non-ferromagnetic conductive material having a thickness from 5 μm up to 2 mm. In this embodiment the remaining faces of the detection module may be coated by non-ferromagnetic materials, for example, materials selected from:

non-ferromagnetic conductive metals, preferably copper, silver, gold, and
non-metallic composites, such as composites based on carbon fibers.

According to particular embodiments of the hybrid device, the first section of the module surface coated with graphene is structured so as to comprise at least:

a first layer of a substrate having a thickness of between 50 and 200 μm,
a second layer of graphene having a thickness of one or two atoms, such that the graphene is deposited on all faces of the substrate in such a way that the side layers of substrate, that contain graphene, are in contact with the coating of non-ferromagnetic conductive material which protects the remaining surface sections of the detection module, thereby protecting the electronics of said detection module. The substrate of the first layer is a material such as a PET or PMMA sheet. Optionally an additional third protective layer of between 25 and 50 μm of a plastic material, preferably PMMA or polyethylene terephthalate, is provided on the graphene, forming a sandwich like structure. The graphene layers on the sides of the substrate are used to reduce the electric charge generated in the graphene shield, since these faces are in contact with the conductive metal layer that protects the electronics of each of the modules of the PET device.

An alternative proposed in this invention for shielding the RF field without reducing the passage of scintillating light, is to directly apply the graphene to the output face of the photons generated in the scintillating crystal (face towards the photodetector). In this alternative the scintillating crystal is used as substrate to deposit the graphene. This layer of graphene, also of 1 or 2 atoms thick, preferably and subsequently, is coated with a thin layer of a protective plastic material. It is the same system as the one described above but in this case instead of using a sheet of, for example, PET or PMMA, as a substrate, the scintillator crystal output face is used. Thus, according to a further embodiment, a graphene layer one or two atoms thick covers the output face of the scintillating crystal, which is the face towards the photodetector of the detection module, i.e., between the scintillating crystal and the matrix of photodetectors, being in direct contact with the output face of the scintillating crystal; and said graphene layer is coated with a layer of a protective plastic material, such as ethylene polyterephthalate or polymethyl methacrylate, 50-200 μm thick. In this proposed alternative, the mechanical structure that protects the electronics of each detection module is protected by a RF shield formed by non-ferromagnetic conductive materials in contact with the graphene shield. The RF shield is connected to ground to eliminate the electric charge generated on it.

Thus, according to further particular embodiments of the hybrid device, the first section of module surface coated with graphene is structured so as to comprise at least:

a first layer of graphene arranged directly on the scintillation crystal, said layer of graphene has a thickness of one or two atoms, such that the graphene layer is in contact with the coating of non-ferromagnetic conductive material which protects the remaining sections of the detection module surface, thereby protecting the electronics of said detection module. Optionally, a third protective layer having a thickness between 50-200 μm, of a plastic material, preferably PMMA or ethylene polyterephthalate, is provided on the graphene.

Furthermore, another alternative proposed in this invention is to coat with graphene, without using non-ferromagnetic conductive materials or composites based on carbon fibers, the entire mechanical structure of the detection modules of the hybrid medical imaging device, preferably PET-SPECT devices, or the entire structure of PET-SPECT devices, either on all external surfaces of said detection modules or on the inner faces.

Thus, in the hybrid device of the invention it may occur that both:

the first section corresponding to the output face of the photons generated in the scintillating crystal, is coated with graphene having a thickness of one or two atoms and
the second section corresponding to the remaining faces of the module mechanical structure that do not enclose the scintillating crystal, is coated with graphene
and wherein the surface of the mechanical structure is selected from:
outer surface
inner surface and
both.

When reference is made to a non-ferromagnetic conductive material, it should be understood that it may be a specific one or a combination of at least two.

To further minimize the Eddy currents, an alternative embodiment is also proposed in this invention for any section of the RF shield built with graphene, with non-ferromagnetic conductive materials, or with both. According to this embodiment the shield is achieved by a series of tracks or bands of graphene placed in a sandwich structure. Each track or band is 5 to 20 mm wide separated from each other by tens of μm up to one millimeter (0.01-1 mm) deposited on all faces of the mechanics of each detector module, whether the inner ones or the outer ones. Two layers of this structure, such that there is always spatial overlap between both layers, are necessary to prevent RF penetration.

Thus, in addition, and for any embodiment of the hybrid device the graphene may be forming a structured coating as follows:
- forming a first series of graphene bands 5 to 20 mm wide, spaced apart by a distance of 0.01-1 mm, such that said bands are deposited on all the inner faces or all the outer faces of the mechanical structure of each detection module, or both on inner and outer faces, and
- a second series of graphene bands such that with the first series they form a sandwich structure, and that the bands of the second series are positioned in such a way as to cover the gaps separating the bands of the first series, in a way that there is always spatial overlap between the two series,
- the first and second series of bands being connected to side graphene layers to eliminate the electric charge accumulated in these graphene tracks or bands and
- all these bands are connected to side graphene layers to eliminate the electric charge accumulated in these tracks or bands of graphene, and
- a sheet of a dielectric material, such as polymethylmethacrylate, polyethylene terephalate, lactic polyacid, nylon, or combinations thereof, disposed between both sets of graphene bands, said layer of dielectric material having a thickness of 10 µm to 2.0 mm. Optionally, the dielectric material is further arranged on the second series of graphene bands exposed to contact and handling.

This sandwich like package has a transparency to scintillating light (200-800 nm) of approximately 95-97% avoiding the loss of photons produced by the scintillating crystal (monolithic or pixelated) and that will be collected by the photodetector matrix (SiPMs or APDs).

The Faraday cage described in this alternative embodiment is connected to ground to eliminate the electric charge accumulated in the shield, or a layer of bands is connected to ground and the other layer of bands connected at low potential with respect to ground to form a small capacitor.

Additionally, also for any embodiment of the hybrid device, the non-ferromagnetic conductive material may be forming a structured coating as:
- a first series of bands of non-ferromagnetic conductive material 5 to 20 mm wide, spaced apart by a distance of 0.01-1 mm, such that said bands are deposited on all the inner faces, or on all outer faces of the mechanical structure of each detection module, or both on inner and outer faces, and
- a second series of bands of non-ferromagnetic conductive material in such a way that with the first series they form a sandwich structure and such that the bands of the second series are arranged in such a way as to cover the gaps separating the bands of the first series, so that there is always spatial overlap between the two series,
- the first and second series of bands being connected to side graphene layers to eliminate the electric charge accumulated in these graphene tracks or bands, and
- a sheet of a dielectric material, disposed between both series of bands of non-ferromagnetic conductive material. Optionally, as dielectric material polymethylmethacrylate, polyethylene terephalate, polylactic acid, nylon, or combinations thereof is used, having a thickness of 10 µm to 2.0 mm. Furthermore, optionally, the dielectric material is also disposed on the second series of bands of non-ferromagnetic conductive material exposed to contact and handling.

The Faraday cage also described for this alternative embodiment is connected to ground to eliminate the electric charge accumulated in the shield, or a layer of bands is connected to ground and the other layer of bands is connected to a low potential with respect to ground, to form a small capacitor.

In an alternative embodiment, in the hybrid device of the invention the shield of non-ferromagnetic conductive material is formed by:
- a first series of graphene tracks or bands 5 to 20 mm wide, spaced apart by a distance of 0.01-1 mm and such that said bands are deposited on all the inner faces, or all the outer faces of the mechanical structure of each detection module, or both on inner faces and outer faces, and
- a second series of tracks or bands of non-ferromagnetic conductive material, such that with the first series they form a sandwich structure and such that the bands of the second series are arranged in such a way as to cover the gaps separating the bands or tracks of the first series, such that there is always spatial overlap between the two band series,
- all these bands or tracks of non-ferromagnetic conductive material are connected to one another by a thin track of non-ferromagnetic conductive material (copper, silver or gold) having a width from a few µm to one millimeter (0.01-1 mm) to eliminate the electric charge generated on the tracks,
- a sheet of a dielectric material, such as PMMA polymethylmethacrylate, PET ethylene polyterephalate, PLA lactic acid or nylon or combinations thereof, disposed between both series of tracks or bands of non-ferromagnetic conductive material.

This embodiment which relates to a coating of non-ferromagnetic conductive material in the form of tracks or bands, instead of being a continuous one, can be applied to both cases, to the case where:
- at least the first section is coated with graphene having a thickness of one or two atoms, and
- the second section is coated with graphene, having a thickness of one or two atoms, and to the case where
- the first section is coated with graphene with one or two atoms of thickness, and
- the second section is coated with a non-ferromagnetic conducting material.

The Faraday cage described also for this alternative embodiment is connected to ground to eliminate the electrical charge accumulated in the shield, or one of the band layers is connected to ground and the other band layer is connected to a low potential with respect to ground to form a small capacitor.

Also, for any embodiment of the hybrid device, the detection module may be a gamma ray detector.

The present invention further relates to the use of an imaging device as the one defined above for obtaining anatomical or structural images.

The present invention further relates to a shield or armor against radiofrequency (RF) radiation included and described in any of the embodiments of the device mentioned hereinabove.

The present invention further relates to a shield or armor against radiofrequency (RF) radiation for a medical imaging device comprising:
- at least one scintillating crystal, monolithic or pixelated, and at least one radiation detection module containing at least one matrix of photodetectors and an electronics section, characterized in that said armor comprises:
- a graphene coating or shield, as a continuous coating or in bands, on all faces of the mechanical structure of the detection module, or
- a graphene coating or shield, as a continuous coating or band coating, on at least one face which is the face of the scintillating crystal towards the detection module, combined with a coating of at least one non-ferromagnetic conductive material, as a continuous coating or as a band coating, of the remaining of the faces that do not enclose the scintillating crystal, and said shield forming a Faraday cage connected to ground to eliminate the electric charge generated therein.

The non-ferromagnetic conductive material has a thickness of from 5 µm to 2 mm and may be selected from:
- non-ferromagnetic conductive metals, preferably copper, silver, gold and
- non-metallic composites, such as carbon fiber composites.

For any embodiment of the shield, the graphene coating on all faces of the mechanical structure of the detection module may be a continuous or band-like coating. These bands are separated from each other separated by a dielectric and are arranged in two layers, such that there is always spatial overlap between the two layers.

For any embodiment of the shield, the graphene coating on at least one face—always carrying a graphene coating—which is the face of the scintillating crystal in the direction of the detection module, disposed between the scintillation crystal and the part of the detection module containing the photodetector matrix and the electronics section—may be a continuous coating, or in the form of bands. These bands are separated from each other by a dielectric and arranged in two layers, such that there is always spatial overlap between the two layers.

For any embodiment of the armor, the coating with non-ferromagnetic conductive materials, when these materials are present, can also be a continuous coating, or in the form of bands. These bands are separated from each other by a dielectric, and arranged in two layers, such that there is always spatial overlap between the two layers.

In the shield or armor of the invention, the graphene coating may be structured so as to comprise at least:
- a first layer of a substrate having a thickness of between 50 and 200 µm,
- a second layer of graphene having a thickness of one or two atoms, such that the graphene is deposited on all faces of the substrate such that the side layers of the graphene-containing substrate are in contact with the coating of non-ferromagnetic conductive material which protects the remaining surface sections of the detection module, thereby protecting the electronics of said detection module. The substrate may be of a plastic material such as PTE or PMMA. Optionally, the graphene coating comprises a third additional protective layer of between 25 and 50 µm of a plastic material, preferably PMMA or ethylene polyterephthalate, on the graphene, forming a sandwich like structure.

According to further embodiments, in the shield or armor of the invention the graphene can directly cover the scintillating crystal. Optionally an additional protective layer of between 50-200 µm thick, of a plastic material, preferably PMMA or ethylene polyterephthalate, may be disposed on the graphene.

Furthermore, in the shield or armor of the invention, the graphene, or the non-ferromagnetic conductive material, or both, may be forming a structured coating such as:
- a first series of bands 5 to 20 mm wide, spaced apart by a distance of 0.01-1 mm, such that said bands are deposited on all the inner faces, or on all the outer faces of the mechanical structure of each detection module, or on both, the inner and the outer faces, and
- a second series of bands, such that with the first series they form a sandwich structure, and such that the bands of the second band series is arranged in such a way as to cover the gaps separating the bands of the first series, such that there is always spatial overlap between the two band series,
- the first and second band series, when they are made of graphene, being connected to side graphene layers to eliminate the electric charge accumulated in these graphene tracks or bands,
- these bands, when they are made of non-ferromagnetic conductive material, being connected together by a thin band or track of non-ferromagnetic conductive material (copper, silver or gold) having a width from a few µm to one millimeter (0.01-1 mm) to eliminate the electric charge generated in the tracks, and
- a sheet of a dielectric material, disposed between both band series.

As the dielectric material, polymethylmethacrylate, ethylene terephalate, polylactic acid, nylon, or combinations thereof, with a thickness of 10 µpolym to 2.0 mm, may be used. Optionally, the dielectric material is also disposed on the second band series exposed to contact and handling.

The present invention has as a further object a hybrid medical imaging device, preferably a PET/SPECT device placed inside an MR device, characterized by comprising a RF shield or armor as the one described.

The graphene layer covering the section or sections of the surface of the detection module may be deposited by any conventional method, such as spraying.

The layer of non-ferromagnetic conductive material covering the sections of the detection module may be deposited by any conventional method, such as electrodeposition.

The result of the invention is a design of electromagnetic shield installed in hybrid medical imaging devices, preferably PET or SPECT devices, which allows to build PET/MR or SPECT/MR hybrid devices more compact and therefore with better performance.

DESCRIPTION OF THE DRAWINGS

In order to help in a better understanding of the features of the invention, a set of drawings is attached as an integral part of said description in which the following has been represented by way of illustration.

DESCRIPTION OF PREFERRED EMBODIMENTS

Some examples of preferred embodiments relating to a PET-SPECT device, combined with a dedicated RF coil in a MR device, according to the invention are described below.

Figure 1:
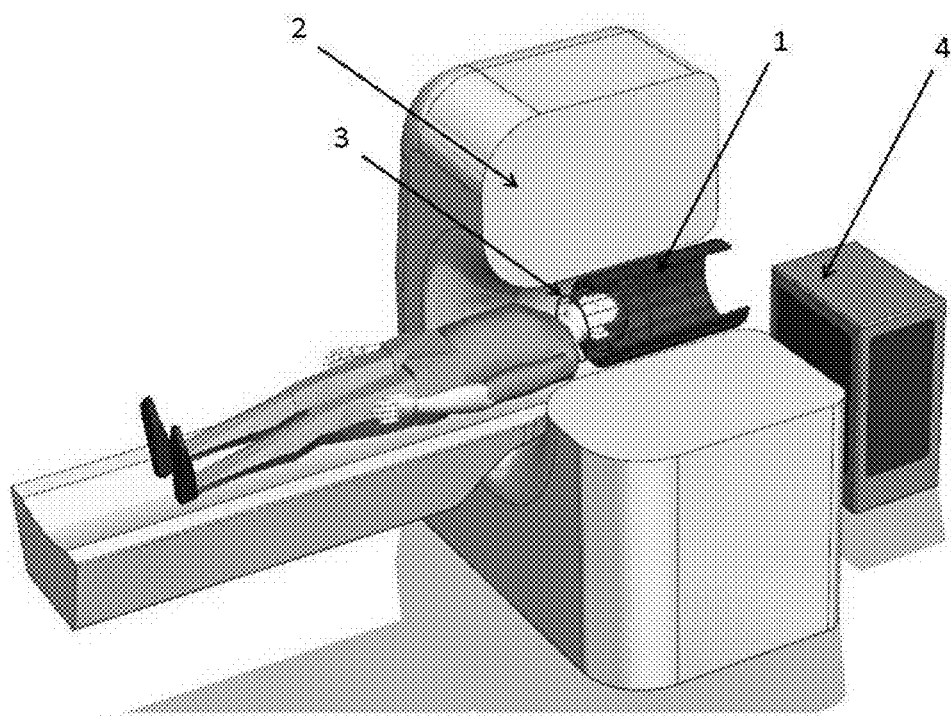
FIG. 1: Shows, according to an embodiment of the invention, a compact and portable PET-SPECT hybrid device with an RF coil placed inside a conventional MR device.

A hybrid PET/MR system is shown in FIG. 1. This system consists of a compact and interposable PET device (1) that can be placed inside MR devices (2) together with an RF coil (3). The signals acquired by the PET device are transmitted via cables, preferably coaxial ones, or optical fibers, to a processing unit placed outside the MR device (4).

Figure 2:
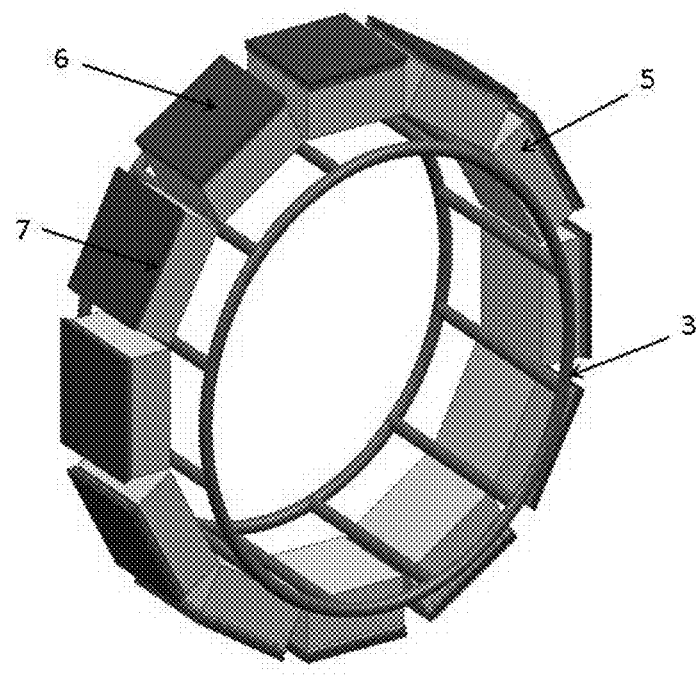
FIG. 2: Shows a perspective view of a portable PET device with an RF coil (bird cage type), according to one embodiment of the invention.

FIG. 2 shows a perspective of the portable PET or SPECT device with a bird cage type RF coil, wherein the structural elements that compose it are appreciated:
 (a) The PET or SPECT device consists of a set of gamma radiation detecting modules, typically radially placed in a ring, the number and diameter of which depend on the MR system and on the organ or organs to be visualized. Each sensor block consists of two elements: the monolithic or pixelated scintillating crystal (5) and the assembly formed by the photodetectors and the associated electronics (6). This assembly is encapsulated inside a Faraday cage to reduce the interference of the RF signals emitted by the coil with the electronics of the detection modules. This Faraday cage is designed not to shield the magnetic fields generated by the gradient system of MR devices.
 (b) A birdcage RF coil (3) coil. This type of RF coil is formed by a series of longitudinal bars joined at the ends to two rings. These longitudinal bars will preferably be placed in the space between the detection modules so as not to impede the passage of the radiation to the detection modules of the PET or SPECT device. The invention described in this patent does not restrict its use to other types of RF coils.

Figure 3:
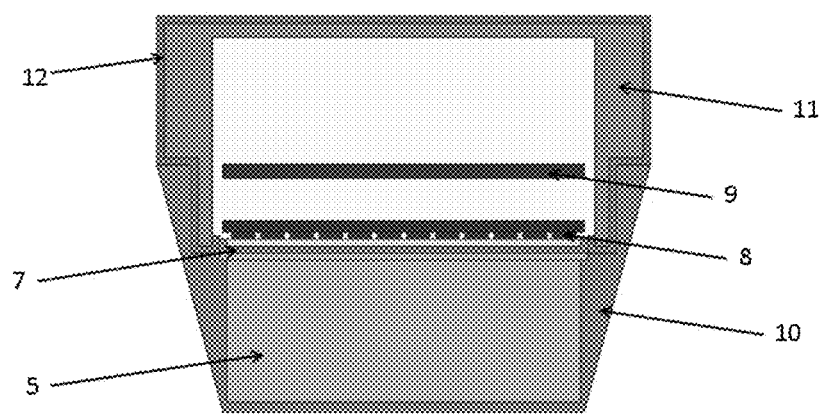
FIG. 3: Shows a cross-section of one of the PET gamma ray modules.

In FIG. 3 the internal structure of a detection module is schematically shown, which is part of the PET device. In this FIG. 3 it is also possible to observe the position of each of the elements forming part of these detection modules composed of the following elements:
 (a) a monolithic or pixelated scintillating crystal, (5) which is responsible for transforming gamma radiation into visible light,
 (b) a graphene based RF shielding system (7), placed between the monolithic or pixelated scintillating crystal, (5) and a matrix of photodetectors (8),
 (c) An electronic plate (9) that pre-processes the signals generated by the photodetectors. Preferably there is also a plate for pre-amplifying the processed signals and that they be sent to the acquisition system (4).

The encapsulation components (10 and 11) of the above-described elements protecting the sensor block (scintillating crystal and photodetectors) from the external light, as well as the proposed RF shield (7 and 12), are also shown in FIG. 3.

Figure 4A:
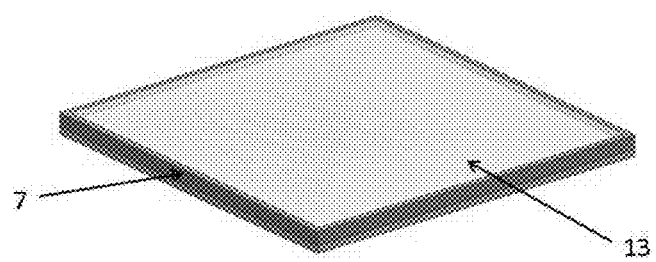
FIGS. 4a and 4b. They respectively show a perspective view and a cross-section of the electromagnetic shield based on graphene.
Figure 4B:

FIGS. 4a and 4b respectively show a perspective and cross-sectional view of the graphene-based RF shield placed between the scintillator crystal and the photodetector matrix. This RF shield will preferably be built in three layers of different materials:
 (a) A mechanically stable substrate (13) of tens of μm on which the different layers of graphene are deposited, and that is placed on the front face of the matrix of photodetectors.
 (a) A graphene layer, 1 or 2 atoms thick (7).
 (c) A protective film of transparent material (14) also a few or tens of pi thick, placed between the graphene layer and the scintillating crystal.

Figure 5:
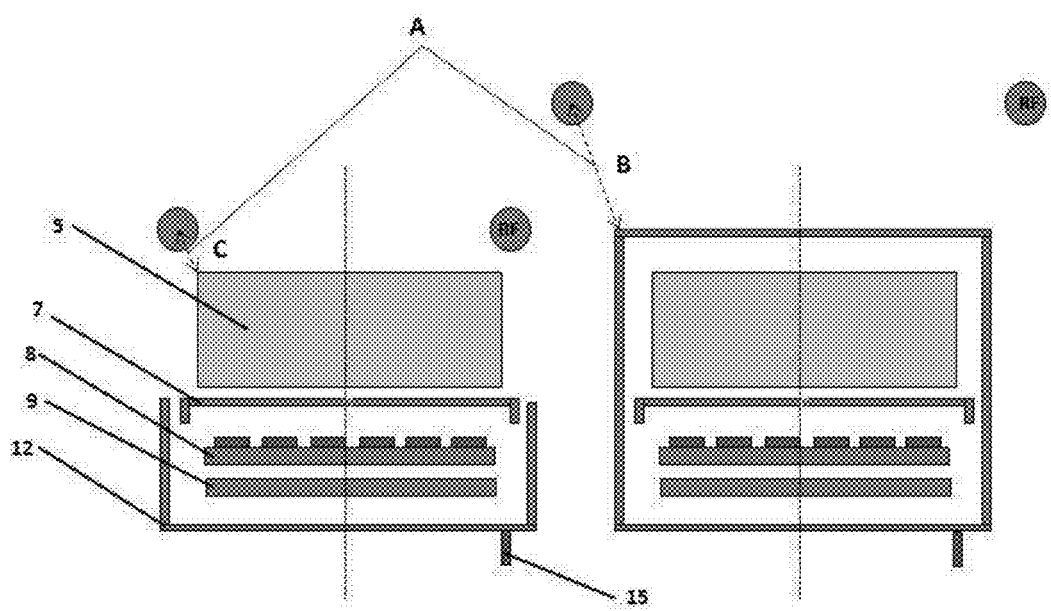
FIG. 5. Comparison between the shielding procedure of this invention (left) and the standard one (right). In this invention, it is observed how the diameter of a ring of detectors can be reduced without distorting the RF field, since the shielding is carried out between the scintillator crystal and photodetectors, and the potential Eddy currents that could be generated will not be generated on the closest face to the RF coil, thus reducing the potential distortion of the field generated by the RF coil.

FIG. 5 shows the difference between the distances of the gamma sensor block to the conductors of the RF coil (A), for one of the proposals of the present invention (left) and the standard case (right). The distance between the coil and the detector shield (B) should be such that no distortions occur in the RF field. In the standard case, this distance will depend on the geometrical configuration of the coil and the PET-SPECT system, in particular on the wrapping where the shield is placed.

With the configuration proposed here, the distance between the conductors, i.e. between the RF coil and the shield must be maintained. However, since the shielding is built between the scintillating crystal and the matrix of photosensors, this allows reducing the distance between the sensor block and the coil (C), increasing the detection efficiency of the PET or SPECT.

Figure 6:
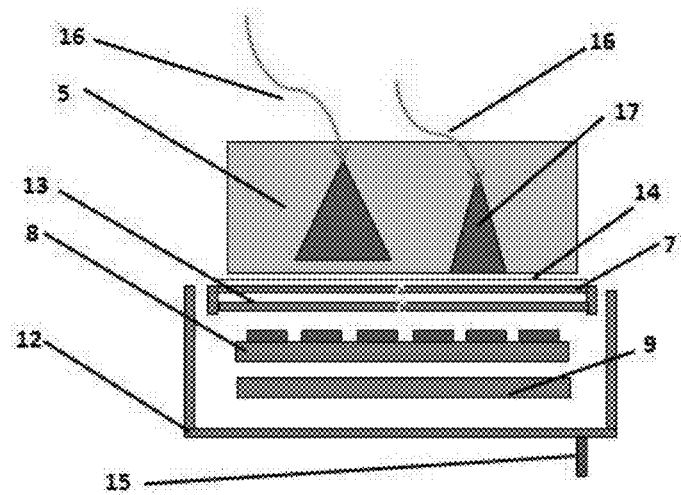
FIG. 6. Exploded view of the internal components of each gamma ray detection module, based on a monolithic or pixelated scintillation crystal, including the electronic and RF shielding elements. In this case, the shielding between the scintillating crystal and the photodetector is carried out through a graphene layer protected on both sides, and said shield is in contact with the remaining part of the shield formed by the non-ferromagnetic conductive material.

FIG. 6 shows in detail the inner elements which preferably make up the detector module. In this figure, in addition to the shielding elements (7) and (12), the substrates for the graphene (13) and (14) are shown in contact with the photodetectors (8) and the scintillation crystal (5) respectively.

In this drawing, the incident gamma ray (16)—which deposits its energy by transforming it into the emission of photons in the range of the visible (17)—is also schematically represented. In particular, the distribution of this visible light generated in a monolithic scintillating crystal and reaching the photodetector has been schematically shown. The Faraday cage formed by (7) and (12) is connected to ground (15) to eliminate the electric charge accumulated in the RF shield.

Figure 7:
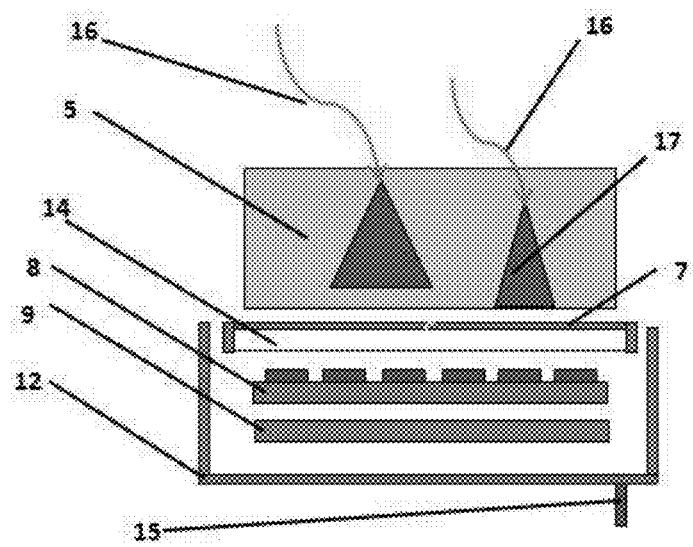
FIG. 7. As for FIG. 6, but in this case according to another embodiment, the graphene is directly deposited on the scintillating crystal and is preferably protected from the direct exposure with a plastic sheet.

FIG. 7 shows, like FIG. 6, the detail of all the elements that make up the detector. In this Figure, and as a difference from FIG. 6—wherein graphene is deposited on a substrate—graphene is directly deposited on the scintillating crystal.

Figure 8:
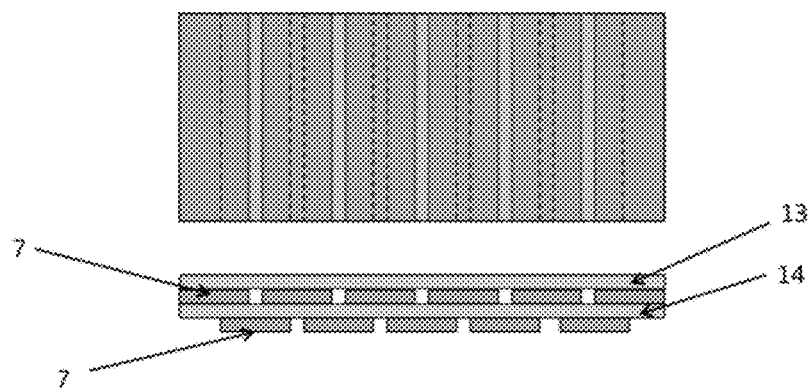
FIG. 8. RF shield formed by two layers of graphene tracks or bands, according to a further embodiment, deposited on the outer and inner faces of a substrate, arranged in such a way as to cover the gaps between the tracks of the other face. An alternative embodiment is formed by tracks or bands of non-ferromagnetic conductive material deposited on the outer or inner faces of a dielectric material.

FIG. 8 shows a perspective and cross-sectional view of an RF shield design based on tracks or bands of graphene (7) deposited on the outer and inner surfaces of a substrate (14) and arranged such that the tracks of one face cover the separation gaps of the tracks of the other faces, to shield the RF signal.

An alternative design to that proposed in FIG. 8, is a system based on bands of non-ferromagnetic conductive material (copper, gold or silver) (7) placed on the outer or inner faces of a dielectric (14), and arranged in such a way that the bands of one face cover the separation gaps of the bands of the other faces, to shield the RF signal.

REFERENCES

[1] A. Nacev, E. Anashkin, J. P. Rigla, J. M. Benlloch, M. Urdaneta, A. Sarwar, P. Stepanov, I. N. Weinberg, J. M. Benlloch and S. T. Fricke, "A quiet, fast, high-resolution desktop MRI capable of imaging solids", Proceedings of ISMRM2014, Milan (Italy).

[2] C. R. Paul, "Introduction to electromagnetic compatibility", Hardcover (2006).

[3] Sri Harsha Maramraju, "Evaluation of Electromagnetic Interactions between PET and MRI systems for Simultaneous MRI/PET Imaging", Stony Brook University (2011).

[4] M. Terpstra, P. M. Andersen and R. Gruetter, "Localized eddy current compensation using quantitative field mapping", J. Magn. Reson. 1998 (131), pp.139-143.

[5] Shuhui Sun et al, "Single-atom catalysis Pt/Graphene achieved through atomic layer deposition", Scientific Reports, Article N°:1775 (2013).

The invention claimed is:

1. A PET/MR or SPECT/MR hybrid medical imaging device comprising:
   at least one scintillating crystal, monolithic or pixelated, and
   at least one radiation detection module containing at least one matrix of photodetectors and a detection, acquisition and transmission electronics section, such that said detection module has a mechanical structure whose surface is divided by at least:
   a first section corresponding to the output face of the photons generated in the scintillating crystal and
   a second section corresponding to the remaining faces of the mechanical structure of the module including at least one matrix of photodetectors and an electronics section and which do not enclose the scintillating crystal, such that said first and second sections form a closed structure, of which:
   at least the first section is covered with graphene, one or two atoms thick and said graphene layer is coated with a layer of a protective plastic material 50-200 µm thick, and
   the second section is coated with graphene, one or two atoms thick, or with a non-ferromagnetic conductive material, and
   wherein the surface of the mechanical structure is selected from:
   outer surface
   inner surface and
   both.

2. The hybrid device according to claim 1, wherein the surface sections of the module are coated forming a Faraday cage and that is connected to ground to eliminate the electric charge generated in the Faraday cage itself.

3. The hybrid device according to claim 1, wherein only the first surface section of the detection module is coated with graphene, said section corresponding to the face of the scintillator crystal in the direction of the detection module, and the second section is coated by at least one non-ferromagnetic conductive material having a thickness of from 5 µm to 2 mm.

4. The hybrid device according to claim 2, wherein only the first surface section of the detection module is coated with graphene, said section corresponding to the face of the scintillator crystal in the direction of the detection module, and the second section is coated by at least one non-ferromagnetic conductive material having a thickness of from 5 µm to 2 mm.

5. The hybrid device according to claim 1, wherein the non-ferromagnetic conductive materials are selected from:
   non-ferromagnetic conductive metals and
   non-metallic composite materials.

6. A hybrid device according to claim 3, wherein the non-ferromagnetic conductive materials are selected from:
   non-ferromagnetic conductive metals, and
   non-metallic composite materials.

7. The hybrid device according to claim 1, wherein the first section of the module surface coated with graphene is structured so as to comprise at least:
   a first layer of a substrate having a thickness of between 50 and 200 µm,
   a second layer of graphene having a thickness of one or two atoms, such that the graphene is deposited on all faces of the substrate in such a way that the side layers of substrate, that contain graphene, are in contact with the coating of non-ferromagnetic conductive material which protects the remaining surface sections of the detection module, thereby protecting the electronics of said detection module.

8. The hybrid device according to claim 1, in which both:
   the first section corresponding to the output face of the photons generated in the scintillating crystal, is coated with graphene having a thickness of one or two atoms, and said graphene layer is coated with a layer of a protective plastic material, 50-200 µm thick, and
   the second section corresponding to the remaining faces of the module mechanical structure that do not enclose the scintillating crystal, is coated with graphene and wherein the surface of the mechanical structure is selected from:
   outer surface
   inner surface and
   both.

9. The hybrid device according to claim 2, in which both:
   the first section corresponding to the output face of the photons generated in the scintillating crystal, is coated with graphene having a thickness of one or two atoms, and said graphene layer is coated with a layer of a protective plastic material, 50-200 µm thick, and
   the second section corresponding to the remaining faces of the module mechanical structure that do not enclose the scintillating crystal, is coated with graphene and wherein the surface of the mechanical structure is selected from:
   outer surface
   inner surface and
   both.

10. A hybrid device according to claim 1, wherein the graphene is forming a structured coating as follows:
    a first series of graphene bands 5 to 20 mm wide, spaced apart by a distance of 0.01-1 mm, such that said bands are deposited on all the inner faces or all the outer faces of the mechanical structure of each detection module, or both on inner and outer faces, and a second series of graphene bands such that with the first series they form a sandwich structure, and that the bands of the second series are positioned in such a way as to cover the gaps separating the bands of the first series, in a way that there is always spatial overlap between the two series, and a sheet of a dielectric material, disposed between both series of graphene bands.

11. The hybrid device according to claim 10, wherein polymethylmethacrylate, ethylene polyterephalate, polylactic acid, nylon, or combinations thereof, having a thickness of 10 μm to 2.0 mm are used as a dielectric material.

12. The hybrid device according to claim 11, wherein the dielectric material is further arranged on the second series of graphene bands exposed to contact and handling.

13. The hybrid device according to claim 1, wherein the non-ferromagnetic conductive material is forming a structured coating as:

a first series of graphene tracks or bands 5 to 20 mm wide, spaced apart by a distance of 0.01-1 mm and such that said bands are deposited on all the inner faces, or all the outer faces of the mechanical structure of each detection module, or both on inner faces and outer faces, and a second series of tracks or bands of non-ferromagnetic conductive material, or graphene, such that with the first series they form a sandwich structure and such that the bands of the second series are arranged in such a way as to cover the gaps separating the bands or tracks of the first series, such that there is always spatial overlap between the two band series, the first and second band series, when they are made of graphene, being connected to side graphene layers to eliminate the electric charge accumulated in these graphene bands or bands, these bands, when they are made of non-ferromagnetic conductive material, being connected together by a thin band or track of non-ferromagnetic conductive material having a width from a few μm to one millimeter to eliminate the electric charge generated in the tracks, and a sheet of a dielectric material, disposed between both band series of non-ferromagnetic conductive material; or graphene and non-ferromagnetic conductive material.

14. The hybrid device according to claim 13, wherein polymethylmethacrylate, ethylene polyterephalate, polylactic acid, nylon, or combinations thereof, having a thickness of 10 μm to 2.0 mm, are used as the dielectric material.

15. The hybrid device according to claim 10, wherein the dielectric material is also disposed on the second series of bands of non-ferromagnetic conductive material that is exposed to contact and handling.

16. The hybrid device according to claim 1, wherein the detection module is a gamma ray detector.

17. A method of using of an imaging device as the one defined in claim 1 in nuclear medicine, the method comprising taking of anatomical or structural images.

18. An armor or shield against radiofrequency (RF) radiation for a medical imaging device comprising:

at least one scintillating crystal, monolithic or pixelated, and at least one radiation detection module containing at least one matrix of photodetectors and an electronics section, wherein said armor comprises:

a graphene coating or shield, as a continuous coating or in bands, on all faces of the mechanical structure of the detection module, or a graphene coating or shield, as a continuous coating or band coating, on all faces of the mechanical structure of the detection module, or on at least one face which is the face of the scintillating crystal towards the detection module, combined with a coating of at least one non-ferromagnetic conductive material, as a continuous coating or as a band coating, of the remaining of the faces that do not enclose the scintillating crystal, and wherein the face of the scintillating crystal towards the detection module is covered with graphene one or two atoms thick, and said graphene layer is coated with a layer of a protective plastic material, 50-200 μm thick; and said armor forming a Faraday cage connected to ground to eliminate the electric charge generated therein.

19. The armor or shield according to claim 18, wherein the non-ferromagnetic conductive material has a thickness of from 5 μm up to 2 mm.

20. The armor or shield according to claim 18, wherein the non-ferromagnetic conductive material is selected from: and may be selected from:
non-ferromagnetic conductive metals, and
non-metallic composites.

21. The armor or shield according claim 18, wherein the graphene coating is structured so as to comprise at least:

a first layer of a substrate having a thickness of between 50 and 200 μm, a second layer of graphene having a thickness of one or two atoms, such that the graphene is deposited on all faces of the substrate in such a way that the side layers of substrate, that contain graphene, are in contact with the coating of non-ferromagnetic conductive material which protects the remaining surface sections of the detection module.

22. The armor or shield according to claim 21, wherein the graphene coating comprises a third additional protective layer of between 25 and 50 μm of a plastic material forming a sandwich like structure.

23. The armor or shield according to claim 18, wherein the graphene directly covers the scintillating crystal.

24. The armor or shield according to claim 23, comprising an additional protective layer of between 50-200 μm thick, of a plastic material disposed on the graphene.

25. The armor or shield according to claim 18, the graphene, or the non-ferromagnetic conductive material, or both, are forming a structured coating as:

a first series of bands 5 to 20 mm wide, spaced apart by a distance of 0.01-1 mm, such that said bands are deposited on all the inner faces, or on all the outer faces of the mechanical structure of each detection module, or on both, the inner and the outer faces, and a second series of bands, such that with the first series they form a sandwich structure, and such that the bands of the second band series is arranged in such a way as to cover the gaps separating the bands of the first series, such that there is always spatial overlap between the two band series, the first and second band series, when they are made of graphene, being connected to side graphene layers to eliminate the electric charge accumulated in these graphene tracks or bands, these bands, when they are made of non-ferromagnetic conductive material, being connected together by a thin band or track of non-ferromagnetic conductive material (copper, silver or gold) having a width from a few μm to one millimeter (0.01-1 mm) to eliminate the electric charge generated in the tracks, and a sheet of a dielectric material, disposed between both band series.

26. The armor or shield according to claim 25, wherein polymethylmethacrylate, ethylene polyterephalate, polylactic acid, nylon, or combinations thereof, having a thickness of 10 μm to 2.0 mm, are used as the dielectric material.

27. The armor or shield according to claim 26, wherein the dielectric material is also disposed on the second series of bands that is exposed to contact and handling.

28. The armor or shield against radiation of radio frequency (RF) according to claim 18, wherein the electronics section of the at least one radiation detection module comprises a detection, acquisition and transmission electronics section such that said detection module has a mechanical structure whose surface is divided by at least:

a first section corresponding to the output face of the photons generated in the scintillating crystal and a second section corresponding to the remaining faces of the mechanical structure of the module including at least one matrix of photodetectors and an electronics section and which do not enclose the scintillating crystal, such that said first and second sections form a closed structure, of which:

at least the first section is covered with graphene, one or two atoms thick, and said graphene layer is coated with a layer of a protective plastic material, 50-200 μm thick, and the second section is coated with graphene, one or two atoms thick, or with a non-ferromagnetic conductive material, and wherein the surface of the mechanical structure is selected from:

outer surface inner surface and both.

29. A hybrid medical imaging device comprising an electromagnetic armor or shield as the one defined in claim 18.

* * * * *